United States Patent
Lou et al.

(10) Patent No.: US 11,054,465 B2
(45) Date of Patent: Jul. 6, 2021

(54) METHOD OF OPERATING A PROBING APPARATUS

(71) Applicant: STAR TECHNOLOGIES, INC., Hsinchu (TW)

(72) Inventors: Choon Leong Lou, Hsinchu (TW); Yi Ming Lau, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 121 days.

(21) Appl. No.: 16/659,319

(22) Filed: Oct. 21, 2019

(65) Prior Publication Data
US 2021/0116496 A1   Apr. 22, 2021

(51) Int. Cl.
*G01R 31/00* (2006.01)
*G01R 31/28* (2006.01)
*G01R 1/073* (2006.01)

(52) U.S. Cl.
CPC ..... *G01R 31/2887* (2013.01); *G01R 1/07342* (2013.01); *G01R 31/2891* (2013.01)

(58) Field of Classification Search
CPC .. G01R 1/06755; G01R 1/07342; G01R 1/44; G01R 31/2601; G01R 31/2874; G01R 31/2887; G01R 31/2891
See application file for complete search history.

(56) References Cited

U.S. PATENT DOCUMENTS

| 4,677,474 A | 6/1987 | Sato et al. |
| 7,576,553 B2 * | 8/2009 | Lou .......................... G01R 1/44 |
| | | 324/750.03 |
| 8,035,405 B2 * | 10/2011 | Lou ..................... G01R 31/2874 |
| | | 324/750.03 |

(Continued)

FOREIGN PATENT DOCUMENTS

| JP | 2011501403 A | 1/2011 |
| KR | 102008-0093410 A | 10/2008 |

(Continued)

OTHER PUBLICATIONS

Office Action dated Jul. 10, 2020 in TW Application No. 108142323 (7 pages).

(Continued)

*Primary Examiner* — Minh N Tang
(74) *Attorney, Agent, or Firm* — Muncy, Geissler, Olds & Lowe, P.C.

(57) ABSTRACT

A method of operating a probing apparatus is disclosed. The method includes providing a chuck configured to support a DUT, a probe card disposed above the DUT and having a probe, and an inspection module configured to determine positions of the DUT and the probe. The method further includes determining a first position of a DUT by an inspection module; moving a probe card to align a first position of a probe with the first position of the DUT; moving a chuck toward the probe; adjusting a temperature of the probe to a predetermined temperature by a temperature-controlling device; determining a second position of the probe by the inspection module after the adjustment of the temperature of the probe; moving the probe card to align the probe with the position of the DUT based on the determination of the second position of the probe; and probing the DUT.

15 Claims, 8 Drawing Sheets

(56) References Cited

U.S. PATENT DOCUMENTS

| | | | |
|---|---|---|---|
| 8,311,758 B2 | 11/2012 | Casler, Jr. et al. | |
| 8,497,693 B2 | 7/2013 | Kiesewetter et al. | |
| 10,068,814 B2* | 9/2018 | Okada | G01R 1/06755 |
| 2005/0083073 A1* | 4/2005 | Nihei | G01R 31/2891 |
| | | | 324/750.19 |

FOREIGN PATENT DOCUMENTS

| | | |
|---|---|---|
| TW | 201725394 A | 7/2017 |
| TW | 201731002 A | 9/2017 |

OTHER PUBLICATIONS

First Office Action issued in corresponding Korean application dated Apr. 20, 2021 (8 pages).

* cited by examiner

METHOD OF OPERATING A PROBING APPARATUS

TECHNICAL FIELD

The present disclosure relates to a method of operating a probing apparatus, and particularly relates to a method of operating a probing apparatus for testing a semiconductor device.

DISCUSSION OF THE BACKGROUND

After fabrication, a semiconductor device under test (DUT), such as a wafer that includes dies, is tested by a probing apparatus. A probe card is used to test electrical properties of the DUT in order to select and discard those DUTs which do not meet the product specifications. Traditionally, the probe card is designed according to the specification and the position of contact pads of the DUT. A probe card includes a plurality of probes, and the position of each probe is precisely adjusted to meet the specification of the DUT in order to carry out accurate electrical testing.

Accordingly, there is a continuous need to precisely control the alignment of the probe card without extensive human intervention.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of operating a probing apparatus. The method includes providing a chuck configured to support a device under test (DUT), a platform with an opening above the chuck, a probe card disposed above the DUT and having a probe, and an inspection module configured to determine positions of the DUT and the probe. The method further includes determining a first position of the DUT by the inspection module, moving the probe card to align a first position of the probe with the position of the DUT, and moving the chuck toward the probe, and adjusting a temperature of the probe to a predetermined temperature by the temperature-controlling device. The method further includes determining a second position of the probe by the inspection module after the adjustment of the temperature of the probe, moving the probe card to align the probe with the position of the DUT based on the determination of the second position of the probe, and probing the DUT.

In some embodiments, the probe card is automatically moved to align the first position of the probe with the first position of the DUT, and the probe card is automatically moved to align the second position of the probe with the first position of the DUT.

In some embodiments, the inspection module optically inspects the probe and the DUT upon the automatic alignment.

In some embodiments, the inspection module includes a first camera disposed above the DUT and configured to optically inspect the DUT, and a second camera disposed under the probe and configured to optically inspect the probe.

In some embodiments, the position of the DUT is determined by the first camera, and the first position and the second position of the probe are determined by the second camera.

In some embodiments, the movement of the probe card includes operating a motor system to automatically move a probing stage and the probe card attached to the probing stage.

In some embodiments, the movement of the probe card includes operating the motor system to move the probing stage in a first direction parallel to the platform, a second direction parallel to the platform and perpendicular to the first direction, and a third direction toward or away from the chuck.

In some embodiments, the movement of the probe card includes operating a motor system to move the probe card in first, second and third directions and to axially rotate the probe card relative to the probing stage. The first direction is parallel to the platform, the second direction is parallel to the platform and perpendicular to the first direction, and the third direction is toward or away from the chuck.

In some embodiments, the probe is proximal to and disposed above the first position of the DUT after the movement of the chuck toward the probe card.

In some embodiments, a distance between the probe and the first position of the DUT is greater than 0.

In some embodiments, the DUT is shifted from the first position to a second position after the adjustment of the temperature of the probe.

In some embodiments, the probe is in contact with the DUT upon the probing of the DUT.

In some embodiments, the method further comprises inspecting the alignment of the second position of the probe with the first position of the DUT by a microscope of the inspection module before the probing of the DUT.

In some embodiments, the probe is shifted from the first position to the second position.

In some embodiments, the method further includes determining a second position of the DUT by the inspection module after the adjustment of the temperature of the probe; and moving the DUT to align the probe with the DUT based on the determination of the second position of the DUT.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
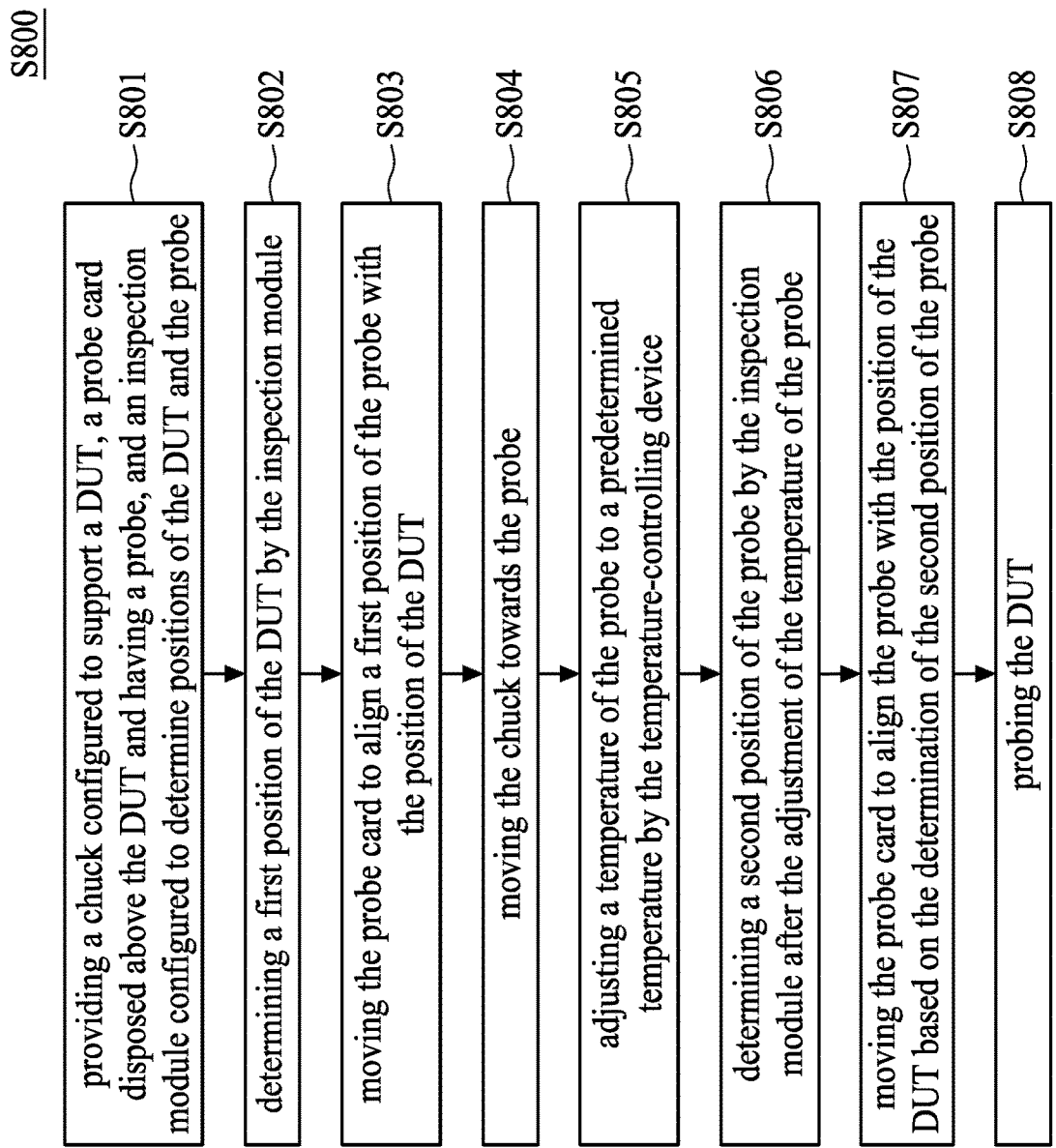
FIG. 1 is a flowchart representing a method of operating a probing apparatus according to aspects of the present disclosure.
Figure 2:
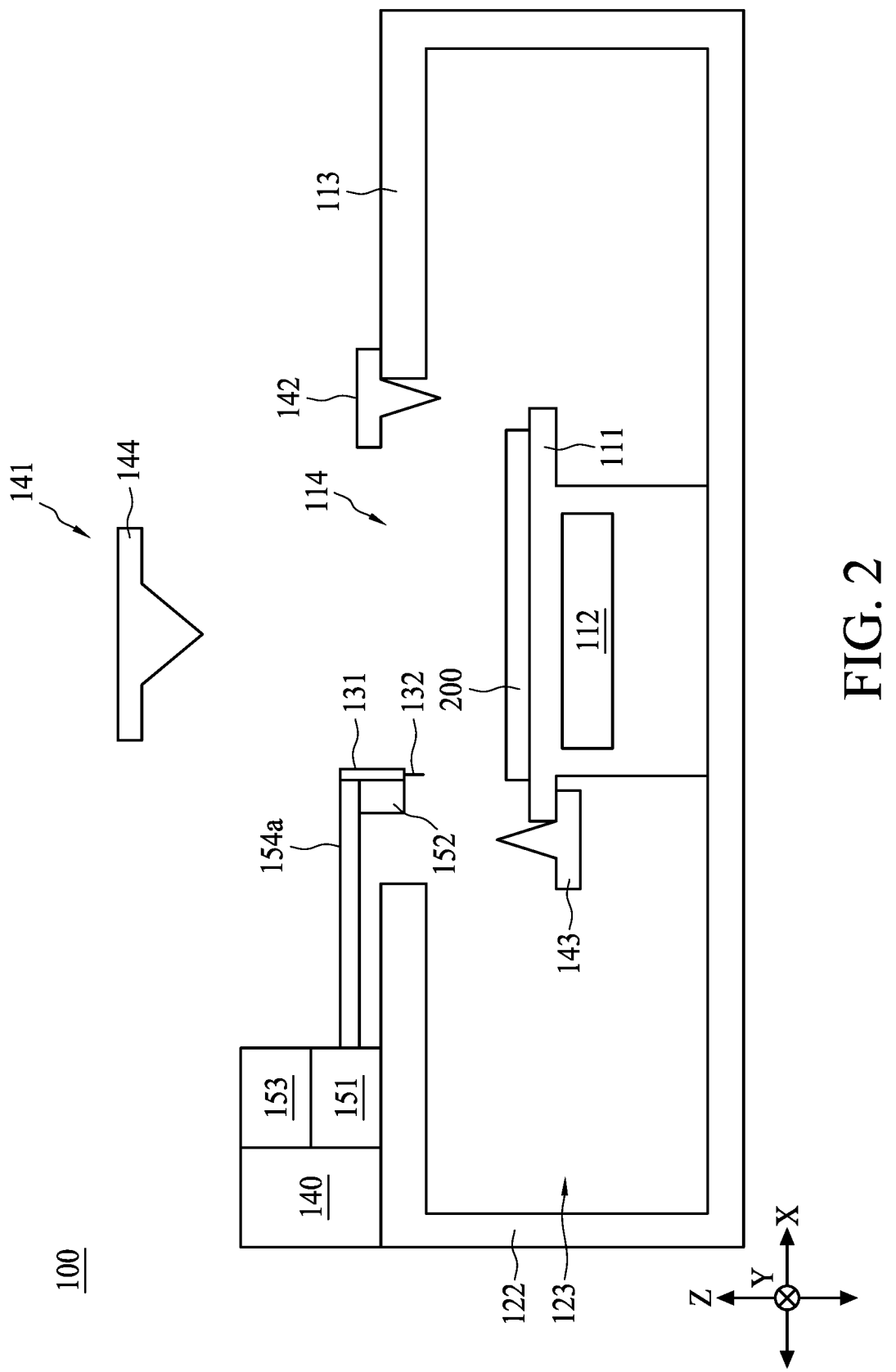
FIG. 2 is a schematic cross-sectional view of a probing apparatus for performing the method in accordance with some embodiments of the present disclosure.

FIG. 1 is a flowchart of a method S800 of operating a probing apparatus 100 according to an embodiment of the present disclosure in which the probing apparatus 100 is operated. FIG. 2 is a schematic drawing illustrating a probing apparatus 100, wherein the method of the present disclosure may be implemented. Referring to FIG. 1, in the present disclosure, the method S800 for operating a probing apparatus 100 is disclosed. The method S800 includes a number of operations and the description and illustration are not deemed as a limitation of the sequence of the operations. The method 800 includes a number of operations S801, S802, S803, S804, S805, S806, 807 and S808 as shown in FIG. 1. In some embodiments, the operations S801, S802, S803, S804, S805, S806, S807 and S808 can be implemented by the probing apparatus 100 illustrated in FIG. 2.

Referring to FIG. 2, the probing apparatus 100 comprises a chuck 111 configured to support the DUT 200, a platform 113 with an opening 114 above the chuck 111, a probe card 131 disposed above the DUT 200 and having a probe 132, and an inspection module 141 configured to determine positions of the DUT 200 and the probe 132.

In some embodiments, a housing 122 is configured to define a testing chamber 123. The chuck 111 and the DUT 200 are arranged in the testing chamber 123. In some embodiments, the chuck 111 is movable along a third direction Z toward or away from the probe card 131. In some embodiments, the opening 114 has a rectangular, circular or polygonal shape.

In some embodiments, a probing stage 152 is attached to the probe card 131. In some embodiments, the movement of the probe card 131 includes operating a first motor system 151 to automatically move the probing stage 152 and the probe card 131 attached to the probing stage 152. In some embodiments, the probing apparatus 100 is equipped with a plurality of probe cards 131, so that the probing may be performed on several dies of the DUT 200 at the same time. In some embodiments, the plurality of probe cards 131 are disposed above the DUT 200, and the probe cards 131 may inspect the DUT 200 simultaneously or separately. In some embodiments, each probe card 131 is attached to a corresponding probing stage 152. In some embodiments, the probing stages 152 are spaced apart from each other. All of the probing stages 152 may have a same size and shape and may be controlled by the first motor system 151, but the disclosure is not limited thereto. In some embodiments, the probing apparatus 100 includes a plurality of first motor systems 151, wherein each probe card 131 can be controlled by a corresponding first motor system 151.

In some embodiments, a distance between adjacent probing stages 152 can be determined based on various factors. The factors may include, for example, number of probing stages 152, moving speed of each of the probing stages 152, size of each of the probing stages 152, position of the DUT 200 or the contact pad 206 on the DUT 200, design rules for the DUT 200, and other factors, as one skilled in the art will understand. In some embodiments, the distances between adjacent pairs of probing stages 152 may be same or different depending on requirements.

Figure 3:
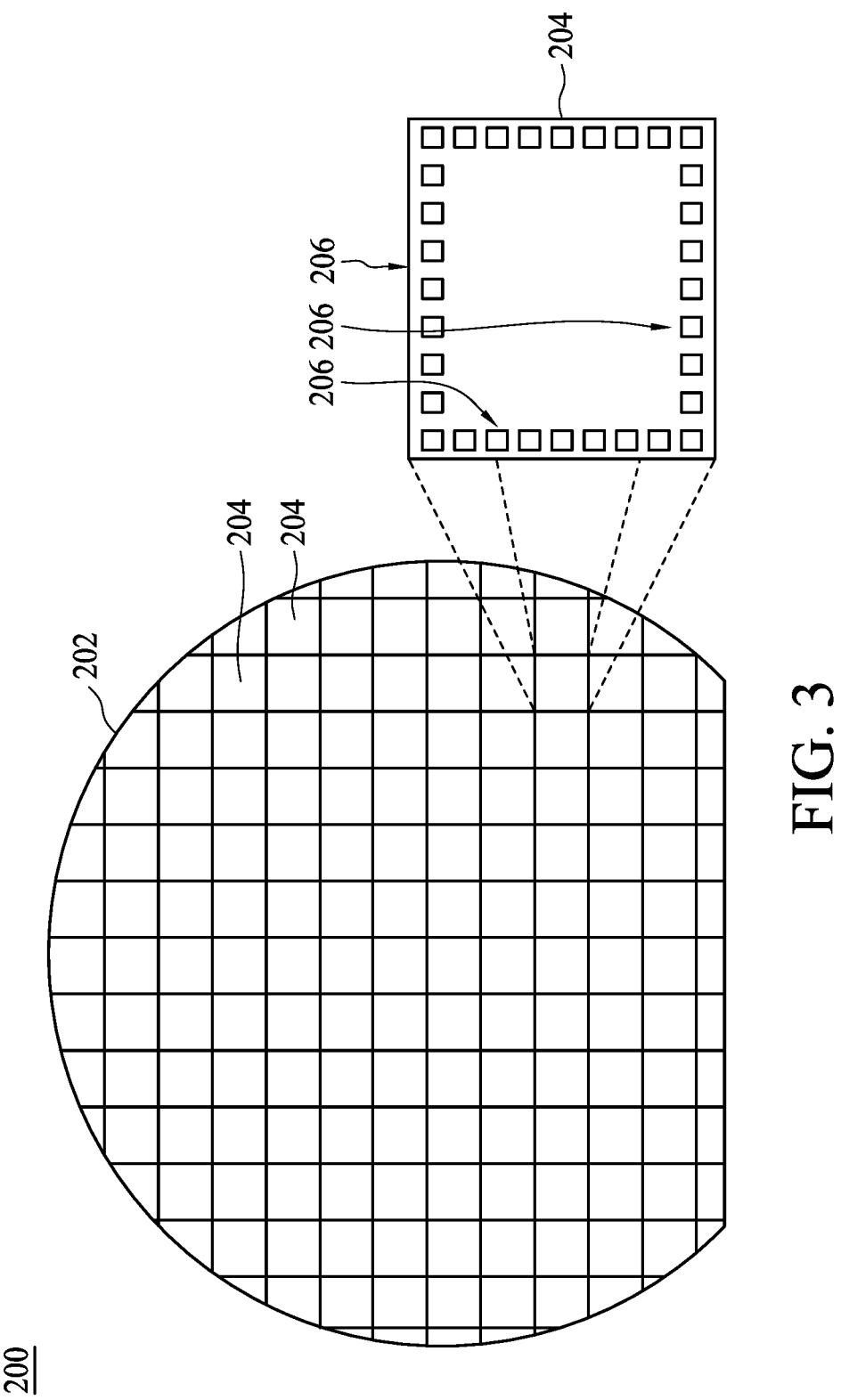
FIG. 3 is a schematic top view of a wafer and a plurality of dies therein.

In some embodiments, the first motor system 151 is configured to automatically align the probe card 131 with the DUT 200 according to information optically obtained by the inspection module 141. In some embodiments, the first motor system 151 is electrically connected to the probing stage 152. In some embodiments, the DUT 200 is a wafer 202 as illustrated in FIG. 3, and the first motor system 151 is configured to automatically align the probe 132 protruding from the probe card 131 with a contact pad 206 of a die 204 on the wafer 202. The first motor system 151 may control the movement of the probe card 131 and the probing stage 152 along a first direction X parallel to the platform 113, along a second direction Y parallel to the platform 113 and perpendicular to the first direction X, or along the third direction Z toward or away from the chuck 111.

In some embodiments, the first motor system 151 is configured to coarsely align the probe 132 with the DUT 200. In some embodiments, the probing apparatus 100 further includes a second motor system 153 configured to automatically control the fine alignment of the probe 132 with the DUT 200. In some embodiments, the second motor system 153 is configured to finely move the probing stage 152 individually or move the probe card 131 individually, such that the probe 132 can align with the DUT 200. The second motor system 153 may control the fine movement of the probe card 131 and probing stage 152 along the first, second and third directions X, Y and Z and may be configured to centrally or axially rotate the probe card 131 relative to the probing stage 152 to align the probe 132 with the DUT 200.

In some embodiments, the probing apparatus 100 further includes a temperature-controlling device 112 configured to adjust temperatures of the DUT 200 and the probes 132 to a predetermined temperature. In some embodiments, the temperature-controlling device 112 is integrated with the chuck 111.

Figure 4:
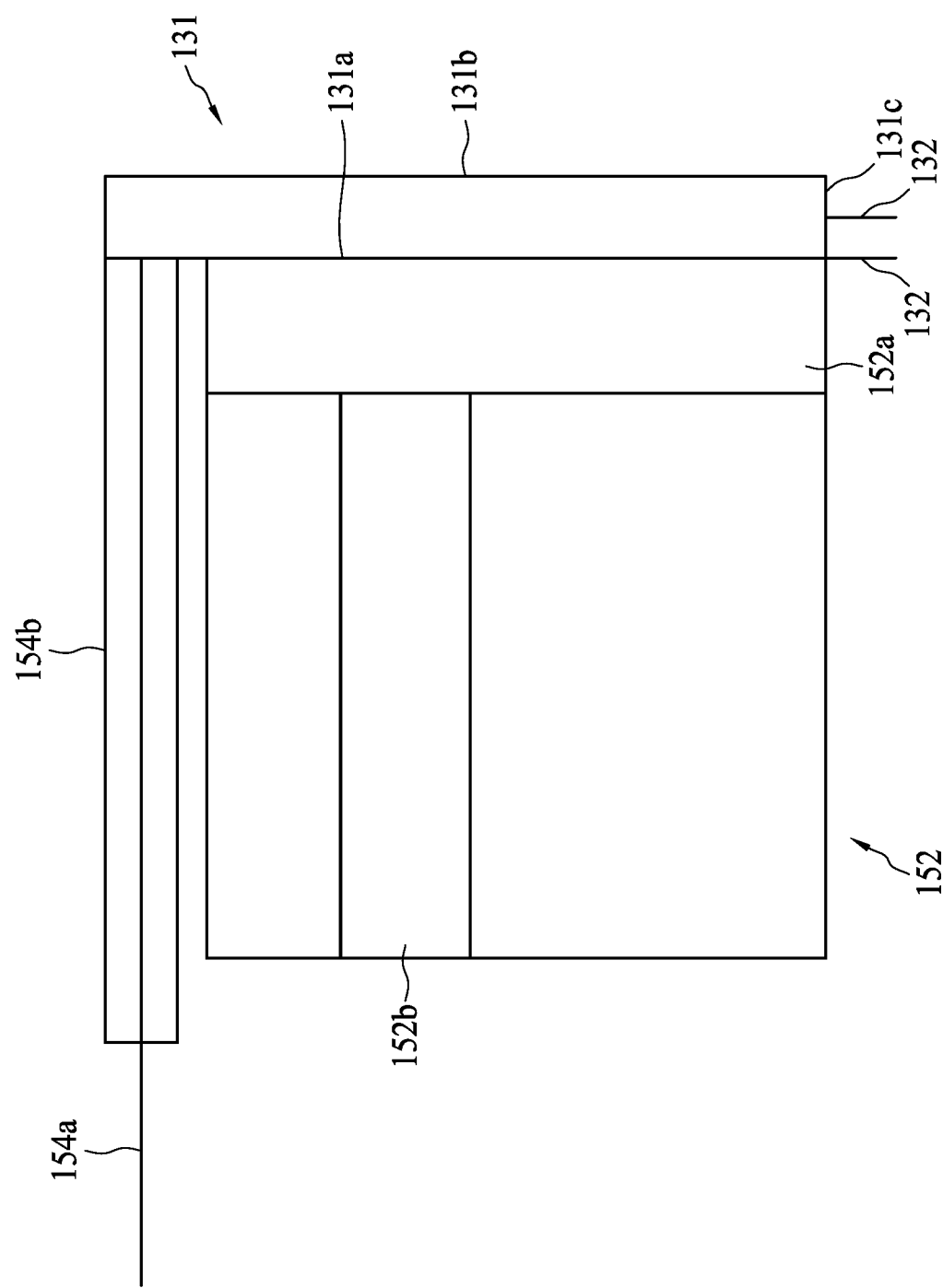
FIG. 4 is a schematic cross-sectional view of a probing stage and a probe card for performing the method in accordance with some embodiments of the present disclosure.

FIG. 4 is a schematic cross-sectional view of a probing stage 152 and a probe card 131 in accordance with some embodiments of the present disclosure. Referring to FIG. 4, the probe 132 protrudes from the probe card 131 and toward the DUT 200. The probe card 31 may include a plurality of probes 132. In some embodiments, the probing stage 152 further includes a carrier 152a configured to hold the probe card 131. In some embodiments, the probe card 131 is attached to a vertical sidewall of the probing stage 152. In some embodiments, the probe card 131 attached to the probing stage 152 is visible from the top view. In some embodiments, the probe card 131 attached to the probing stage 152 is covered by the carrier 152a from the top view.

In some embodiments, a cable 154a is configured to transmit the signal from the probe card 131 to the DUT 200. In some embodiments, the cable 154a is disposed in a cable housing 154b. In some embodiments, the cable 154a is disposed at the top side of the probe card 131.

In some embodiments, the probe card 131 includes a first surface 131a, a second surface 131b and a peripheral wall 131c. The second surface 131b is opposite to the first surface 131a, and the peripheral wall 131c is substantially orthogonal to and disposed between the first surface 131a and the second surface 131b. A plurality of probes 132 protrude from the peripheral wall 131c and toward the DUT 200. In some embodiments, arrangement of the probes 132 matches the settings of the probe card 131 and the design of the DUT 200. In some embodiments, the first surface 131a of the probe card 131 is attached to the vertical sidewall of the probing stage 152.

Referring back to FIG. 2, in some embodiments, the probing apparatus 100 further includes the inspection module 141. The inspection module 141 is configured to determine positions of the DUT 200 and the probe 132. In some embodiments, the inspection module 141 optically inspects the probe 132 and the DUT 200 upon the automatic alignment. In some embodiments, the inspection module 141 has at least one predetermined field of view. In some embodiments, the inspection module 141 is electrically connected to the first motor system 151 and the second motor system 153. In some embodiments, the inspection module 141 includes a first camera 142 disposed above the DUT 200 and configured to optically inspect the DUT 200, and a second camera 143 is disposed under the probe 132 and configured to optically inspect the probe 132. In some embodiments, the first camera 142 is disposed at the periphery of the opening 114. In some embodiments, the second camera 143 is attached to the chuck 111.

In some embodiments, the inspection module 141 includes an optical microscope 144 disposed above the platform 113 and able to capture an image of the DUT 200 and/or the probe 132 through the opening 114. The optical microscope 144 is configured to inspect the location of the DUT 200, the probe 132, the probe card 131 and the probing stage 152 along the first, second and third directions X, Y and Z, and is configured to inspect the axial rotation of the probe card 131 relative to the probing stage 152.

In some embodiments, the probing apparatus 100 further includes a test module 140 electrically connected to the probe card 131. The test module 140 is configured to process signals detected by the probe card 131 and adjust the position of the DUT 200. In some embodiments, the test module 140 is configured to control the position of the DUT 200 by moving the chuck 111 along the third direction Z toward or away from the probe 132. In some embodiments, a cable 154a electrically connects the test module 140 to the probe card 131.

Referring back to FIGS. 1 and 2, the DUT 200 is disposed on the chuck 111, and the method S800 begins with operation S801. In operation S801, the chuck 111 configured to support the DUT 200, the platform 113 with the opening 114 above the chuck, the probe card 131 disposed above the DUT and having the probe 132, and the inspection module 141 configured to determine positions of the DUT and the probe are provided.

The method S800 continues with operation S802, in which a first position 200a of the DUT 200 is determined by the inspection module 141. In some embodiments, the DUT 200, such as a semiconductor device or a wafer, is tested by the method S800. The first position 200a of the DUT 200 is away from the probe 132. In some embodiments, the first position 200a of the DUT 200 is determined by the first camera 142. In some embodiments, the operation S802 includes defining and selecting the location of the DUT 200 on the wafer map. The wafer map may be set up based on the properties of the DUT 200, such as the size and the orientation, or other properties of the DUT 200. Further, in step S802, the probe card 131 may dispose within the opening 114 of the platform 113 and above the DUT 200.

Figure 5:
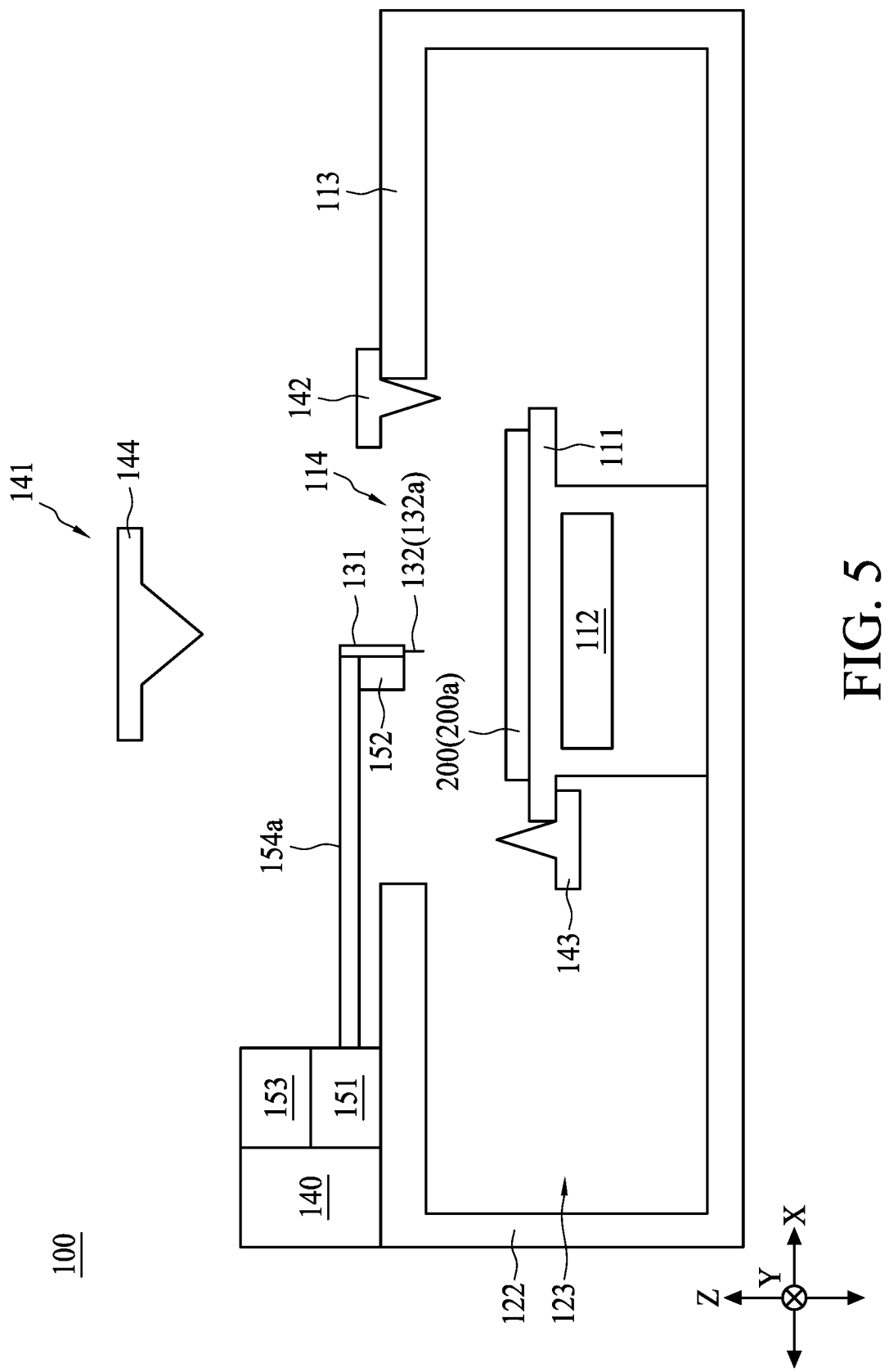
FIGS. 5 to 8 are schematic cross-sectional views of a probing apparatus for performing the method in accordance with some embodiments of the present disclosure.

Referring to FIG. 5, the method S800 continues with operation S803, in which the probe card 131 is moved to align a first position 132a of the probe 132 with the first position 200a of the DUT 200. In some embodiments, the first position 132a of the probe 132 is determined by the second camera 143. In some embodiments, operation S803 includes coarsely aligning the probe 132 with the DUT 200. In some embodiments, the alignment includes using the first motor system 151 to move the probe stage 152 along the first and second directions X, Y to align the first position 132a of the probe 132 with the first position 200a of the DUT 200. In some embodiments, the coarsely alignment includes aligning the probe 132 with the contact pad 206 on the DUT 200. In some embodiments, the probe card 131 is automatically and accurately moved to align the first position 132a of the probe 132 with the first position 200a of the DUT 200. In some embodiments, the inspection module 141 optically inspects the probe 132 and the DUT 200 upon the automatic alignment. The coarsely alignment may include using at least one of the first camera 142 and the second camera 143 to inspect the probe 132.

Figure 6:
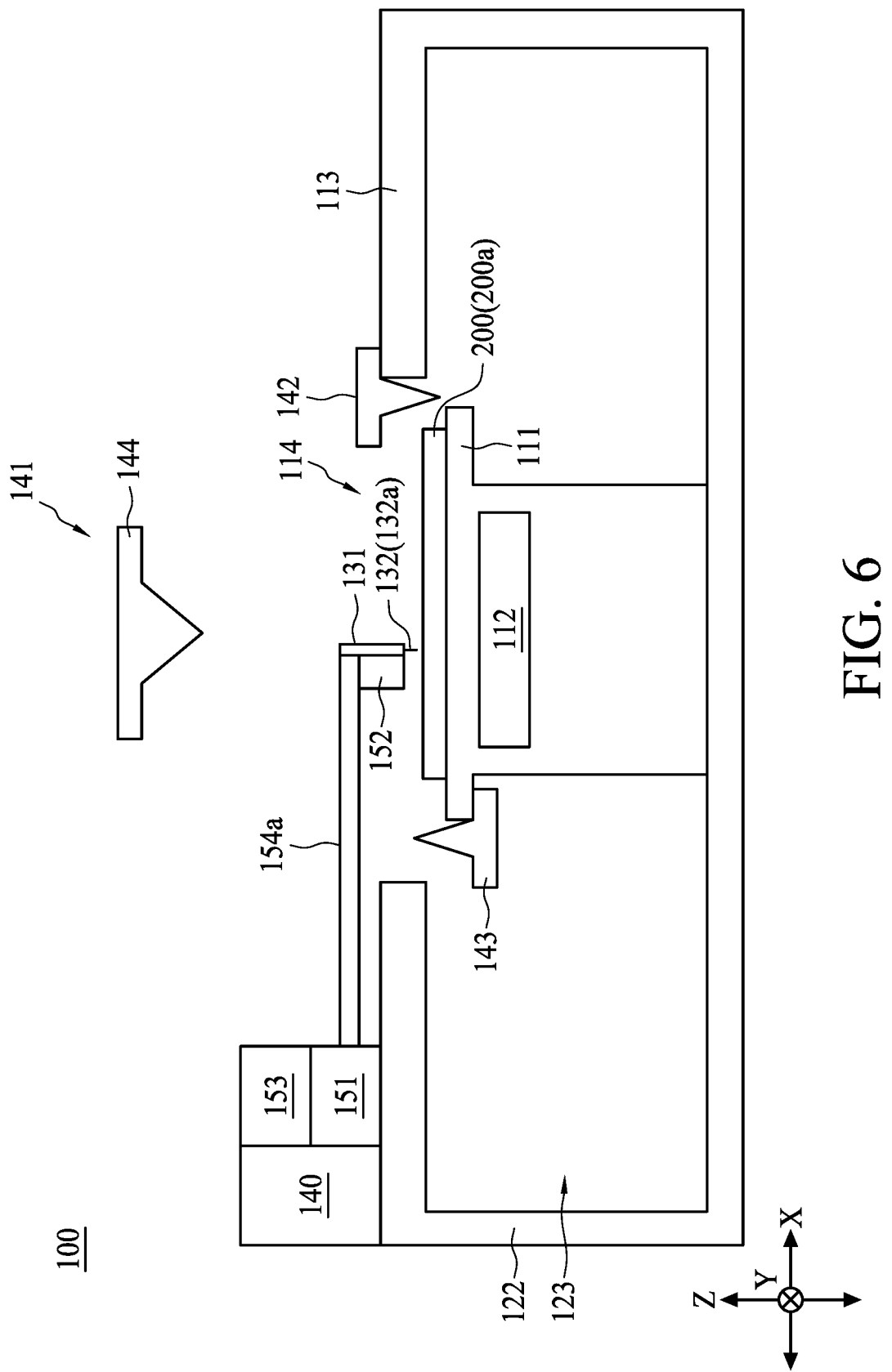

Referring to FIG. 6, the method S800 continues with operation S804, in which the chuck 111 is moved toward the probe 132 along the third direction Z. The distance between the probe 132 and the DUT 200 is not limited, as long as the temperature-controlling device 112 integrated with the chuck 111 may adjust the temperature of the probe 132. In some embodiments, the probe 132 is proximal to and disposed above the DUT 200 after the movement of the chuck 200 toward the probe card 131. In some embodiments, a distance between the DUT 200 and the probe 132 or between the DUT 200 and the tip portion of the probe 132 is substantially greater than 0 but less than 10 mm, that is, the probe 132 and the DUT are close to but not in contact with each other in operation S804. In some embodiments, the microscope 144 inspects the alignment of the first position 132a of the probe 132 with the first position 200a of the DUT 200 in the first and second directions X, Y. In some embodiments, the second camera 143 optically inspects the probe 132 during the movement. In some embodiments, the second camera 143 moves with the chuck 111. In some embodiments, the test module 140 adjusts the movement of the chuck 111. In some embodiments, after the operation S803, the probe 132 is coarsely aligned with the DUT 200. In some embodiments, after the operation S804, the probe 132 is coarsely aligned with the contact pad 206 on the DUT 200.

The method S800 continues with operation S805, in which a temperature of the probe 132 is adjusted to a predetermined temperature by the temperature-controlling device 112 integrated with the chuck 111. In some embodiments, the temperature-controlling device 112 changes the temperature of the DUT 200 and the temperature of the chuck 111. Since the DUT 200 and the chuck 111 are proximal to the probe 132 after the movement of the chuck 111, the heat of the DUT 200 or the chuck 111 is transmitted to the probe 132 and changes the temperature of the probe 132 or the temperature of the tip portion of the probe 132. In some embodiments, the probe 132 or the tip portion of the probe 132 is adjusted to the predetermined temperature by the heat from the DUT 200 or the chuck 111 after a predetermined duration. The DUT 200 and the chuck 111 remain proximal to the probe 132 for the predetermined duration until the probe 132 or the tip portion of the probe 132 is adjusted the predetermined temperature. In some embodiments, the predetermined duration is about 30 to 60 minutes.

In some embodiments, the temperature-controlling device 112 heats the chuck 111 after operation S803 and before operation S805. Because the DUT 200 directly contacts the chuck 111, the temperature of the DUT 200 is also adjusted. In some embodiments, after operation S804, the DUT 200 and/or the chuck 111 adjusts the temperature of the probe 132, or at least the tip portion of the probe 132.

As one skilled in the art is aware, the accuracy of the alignment of the probe 132 with the DUT 200 determines the accuracy of the probing. In some embodiments, after moving the probe card 131 to align the first position 132a of the probe 132 with the position of the DUT (operation S803), the chuck 111 moves toward the probe 132 until the DUT 200 and the probe 132 are in contact with each other (operation S804). The heat may be transmitted from the temperature-controlling device 112 to the probe 132 by thermal conduction through the contact of the probe 132 and the DUT 200 (operation S805). However, the temperature change of the probe 132 or the tip portion of the probe 132 may change the volume of the probe 132. As a result, the probe 132 may become misaligned with the DUT 200 after the temperature adjustment of the probe 132. That is, regardless of how accurate the probe 132 in the first position is aligned with the DUT 200 in the first position, the alignment may shift after the temperature is adjusted. Therefore, a fine alignment of the probe 132 relative to the DUT 200 is necessary.

The method S800 continues with operation S806, in which a second position 132b of the probe 132 is determined by the inspection module 141 after the adjustment of the temperature of the probe 132. In some embodiments, the second camera 143 determines the second position 132b of the probe 132.

Figure 7:
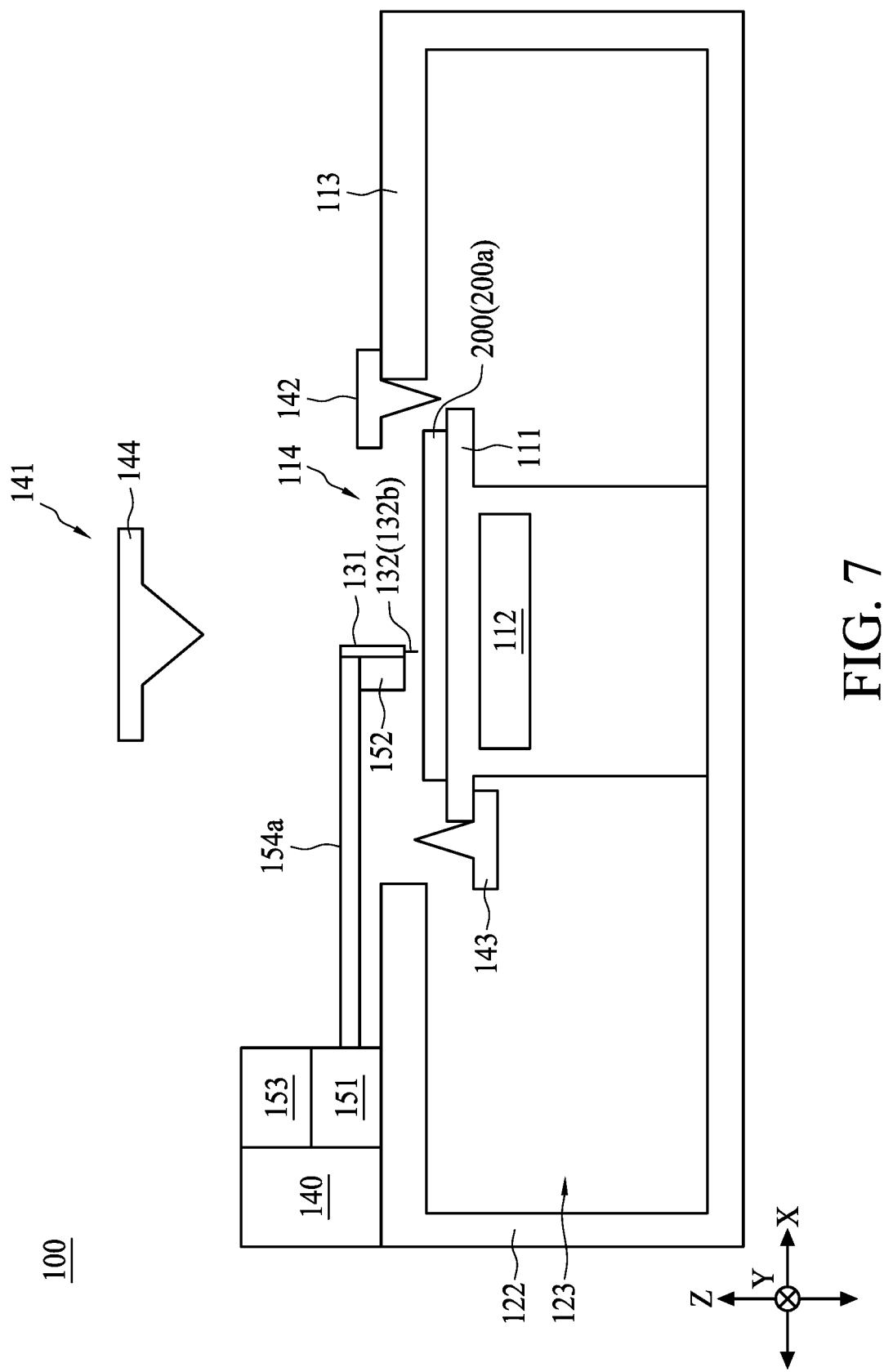

Referring to FIG. 7, the method S800 continues with operation S807, in which the probe 132 is tuned before probing. In operation S807, the probe card 131 is moved to align the probe 132 with the first position 200a of the DUT 200 based on the determination of the second position 132b of the probe 132. In some embodiments, operation S807 includes finely aligning the probe 132 with the DUT 200. The fine aligning may include using the second camera 143 to inspect the probe 132. In some embodiments, the fine aligning includes operating the second motor system 153 to move the probe stage 152 along the first, second and third directions X, Y and Z and centrally or axially rotating the probe card 131 relative to the probing stage 152 to finely align the probe 132 with the first position 200a of the DUT 200. In some embodiments, the probe 132 is automatically moved to accurately align the second position 132b of the probe 132 with the first position 200a of the DUT 200. In some embodiments, the inspection module 141 optically inspects the probe 132 and the DUT 200 during the automatic alignment. In some embodiments, the microscope 144 inspects the alignment of the second position 132b of the probe 132 with the first position 200a of the DUT 200 in the first and second directions X, Y during operation S807.

In some embodiments, in order to adjust the position along the third direction Z, the method S800 further includes aligning the DUT 200 before probing. In some embodiments, the method S800 includes moving the DUT 200 along the third direction Z to a second position 200b of the DUT 200 after operation S807, or after operation S806 and before operation S807. In some embodiments, the test module 140 adjusts the movement of the chuck 111. In some embodiments, the microscope 144 inspects the alignment of the second position 132b of the probe 132 with the second position 200b of the DUT 200 in the first and second directions X, Y before the probing of the DUT 200. In some embodiments, the first camera 142 optically inspects the DUT 200 and the second camera 143 optically inspects the probe 132 during the movement.

Figure 8:
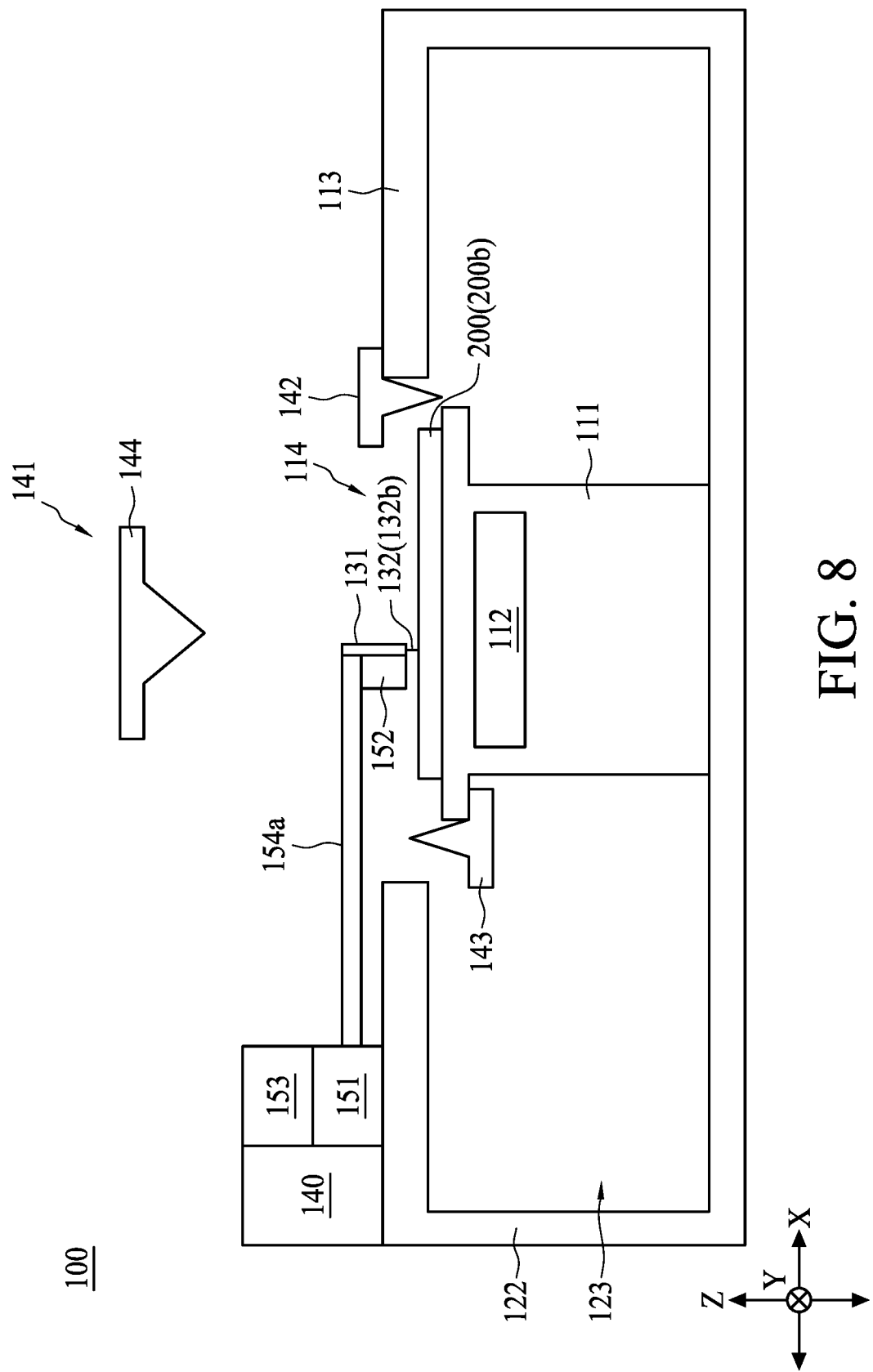

Referring to FIG. 8, the method S800 continues with operation S808, in which the probe 132 probes the DUT 200. Upon the probing of the DUT 200, the probe 132 has the predetermined temperature and is in contact with the DUT 200. In some embodiments, the probe 132 is in contact with the contact pad 206 of the die 204 on the wafer 202. In some embodiment, if further alignment of the DUT 200 and the probe 132 is not required, the probe 132 makes contact with the DUT 200 when the DUT 200 is in the first position 200a. In some embodiment, if the DUT 200 has further aligned with the probe 132, the probe 132 makes contact with the DUT 200 when the DUT 200 is in the second position 200b. In some embodiments, the signal detected by the probe 132 is processed by the test module 140.

In some embodiments, the probe 132 and the DUT 200 are forcefully driven against each other during probing. The forceful driving may be achieved by moving the chuck 111 in such a manner as to not only bring the probe 132 in contact with the DUT 200, but to also press the probe 132 against the DUT 200.

In some embodiments, a plurality of probes 132 are, simultaneously or separately, automatically aligned with the DUT 200 by the method S800. In some embodiments, the method S800 may effectively align a plurality of probe cards 131 with the DUT 200.

Accordingly, the present disclosure therefore provides a method of operating a probing apparatus. The method includes providing a chuck configured to support a device under test (DUT), a probe card disposed above the DUT and having a probe, and an inspection module configured to determine positions of the DUT and the probe. The method further includes determining a first position of the DUT by the inspection module, moving the probe card to align a first position of the probe with the position of the DUT, moving the chuck toward the probe, and adjusting a temperature of the probe to a predetermined temperature by the temperature-controlling device. The method further includes determining a second position of the probe by the inspection module after the adjustment of the temperature of the probe, moving the probe card to align the probe with the position of the DUT based on the determination of the second position of the probe, and probing the DUT. Consequently, the probe card moves automatically and accurately to align the probe with the DUT.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method of operating a probing apparatus comprising:
providing a chuck configured to support a device under test (DUT), a probe card disposed above the DUT and having a probe, and an inspection module configured to determine positions of the DUT and the probe;
determining a first position of the DUT by the inspection module;
moving the probe card to align a first position of the probe with the first position of the DUT;
moving the chuck toward the probe;
adjusting a temperature of the probe to a predetermined temperature by a temperature-controlling device;
determining a second position of the probe by the inspection module after the adjustment of the temperature of the probe;
moving the probe card to align the probe with the DUT based on the determination of the second position of the probe; and
probing the DUT.

2. The method of claim 1, wherein the probe card is automatically moved to align the first position of the probe with the first position of the DUT, and the probe card is automatically moved to align the second position of the probe with the first position of the DUT.

3. The method of claim 2, wherein the inspection module optically inspects the probe and the DUT upon the automatic alignment.

4. The method of claim 3, wherein the inspection module includes a first camera disposed above the DUT and configured to optically inspect the DUT, and a second camera disposed under the probe and configured to optically inspect the probe.

5. The method of claim 4, wherein the first position of the DUT is determined by the first camera, and the first position and the second positions of the probe are determined by the second camera.

6. The method of claim 1, wherein the movement of the probe card includes operating a motor system to automatically move a probing stage and the probe card attached to the probing stage.

7. The method of claim 6, wherein a platform with an opening above the chuck, and wherein the movement of the probe card includes operating the motor system to move the probing stage in a first direction parallel to the platform, a second direction parallel to the platform and perpendicular to the first direction, and a third direction toward or away from the chuck.

8. The method of claim 6, wherein a platform with an opening above the chuck, and wherein the movement of the probe card includes operating a motor system to move the probe card in a first direction parallel to the platform, a second direction parallel to the platform and perpendicular to the first direction, and a third direction toward or away from the chuck, and to axially rotate the probe card relative to the probing stage.

9. The method of claim 1, wherein the probe is proximal to and disposed above the first position of the DUT after the movement of the chuck toward the probe card.

10. The method of claim 9, wherein a distance between the probe and the first position of the DUT is greater than 0.

11. The method of claim 9, wherein the DUT is shifted from the first position to a second position after the adjustment of the temperature of the probe.

12. The method of claim 1, wherein the probe is in contact with the DUT upon the probing of the DUT.

13. The method of claim 1, further comprising inspecting the alignment of the second position of the probe with the first position of the DUT by a microscope of the inspection module before the probing of the DUT.

14. The method of claim 1, wherein the probe is shifted from the first position to the second position.

15. The method of claim 1, further comprising:
determining a second position of the DUT by the inspection module after the adjustment of the temperature of the probe; and
moving the DUT to align the probe with the DUT based on the determination of the second position of the DUT.

* * * * *